(12) United States Patent
Twieg

(10) Patent No.: US 12,352,834 B2
(45) Date of Patent: *Jul. 8, 2025

(54) SYSTEMS AND METHODS FOR PROVIDING OPERATING POWER TO AN MAGNETIC RESONANCE IMAGING (MRI) SYSTEM

(71) Applicant: Hyperfine Operations, Inc., Guilford, CT (US)

(72) Inventor: Michael Twieg, New Haven, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/393,213

(22) Filed: Dec. 21, 2023

(65) Prior Publication Data

US 2024/0125877 A1 Apr. 18, 2024

Related U.S. Application Data

(63) Continuation of application No. 17/466,952, filed on Sep. 3, 2021, now Pat. No. 11,860,255.

(60) Provisional application No. 63/075,508, filed on Sep. 8, 2020.

(51) Int. Cl.
*G01R 33/385* (2006.01)
*G01R 33/44* (2006.01)
*G01R 33/563* (2006.01)

(52) U.S. Cl.
CPC ....... *G01R 33/3852* (2013.01); *G01R 33/445* (2013.01); *G01R 33/56341* (2013.01)

(58) Field of Classification Search
None
See application file for complete search history.

(56) References Cited

U.S. PATENT DOCUMENTS

| | | | |
|---|---|---|---|
| 4,088,937 | A | 5/1978 | Uchida et al. |
| 5,270,657 | A | 12/1993 | Wirth et al. |
| 5,617,030 | A | 4/1997 | Fischer et al. |
| 5,808,376 | A | 9/1998 | Gordon et al. |
| 5,909,120 | A | 6/1999 | Mori et al. |

(Continued)

FOREIGN PATENT DOCUMENTS

DE 10 2016 208 123 B4 3/2020

OTHER PUBLICATIONS

International Preliminary Report on Patentability for International Application No. PCT/US2021/049058 mailed Mar. 23, 2023.

(Continued)

*Primary Examiner* — Rodney E Fuller
(74) *Attorney, Agent, or Firm* — Foley & Lardner LLP

(57) ABSTRACT

Systems and methods for operating a magnetic resonance imaging (MRI) system are provided. The MRI system includes a magnetics system and a power system configured to provide power to at least some of the magnetics system. The power system includes an energy storage device and a power supply configured to receive mains electricity. The MRI system also includes at least one controller configured to control the MRI system to operate in accordance with a pulse sequence at least in part by generating, by using power supplied by the power supply and supplemental power supplied by the energy storage device, at least one gradient field using at least one gradient coil of the magnetics system.

20 Claims, 8 Drawing Sheets

(56) References Cited

U.S. PATENT DOCUMENTS

| | | |
|---|---|---|
| 5,938,217 A | 8/1999 | Wintz |
| 6,011,396 A | 1/2000 | Eckels et al. |
| 6,051,975 A | 4/2000 | Mori et al. |
| 6,131,690 A | 10/2000 | Galando et al. |
| 6,154,031 A | 11/2000 | Hughes |
| 11,860,255 B2 * | 1/2024 | Twieg ................ G01R 33/3852 |
| 2003/0206425 A1 | 11/2003 | Zhang |
| 2005/0248347 A1 | 11/2005 | Damadian |
| 2010/0172468 A1 | 7/2010 | Gregerson |
| 2011/0210731 A1 | 9/2011 | Walsh |
| 2015/0005618 A1 | 1/2015 | Dumoulin |
| 2015/0054509 A1 | 2/2015 | Smits et al. |
| 2015/0226817 A1 | 8/2015 | Pourrahimi |
| 2017/0045595 A1 | 2/2017 | Machii et al. |
| 2017/0102441 A1 | 4/2017 | Ganesh et al. |
| 2017/0176555 A1 | 6/2017 | Kawajiri et al. |
| 2019/0056468 A1 | 2/2019 | Connell |
| 2019/0099141 A1 | 4/2019 | Garlow et al. |
| 2019/0137581 A1 | 5/2019 | Kawajiri et al. |
| 2019/0369182 A1 | 12/2019 | Singh et al. |
| 2020/0355761 A1 | 11/2020 | Mcnulty et al. |
| 2021/0003646 A1 | 1/2021 | Vernickel et al. |
| 2022/0354378 A1 | 11/2022 | Nacev et al. |
| 2024/0168105 A1 | 5/2024 | Inglis et al. |

OTHER PUBLICATIONS

International Search Report and Written Opinion for International Application No. PCT/US2021/049058 mailed Nov. 30, 2021.

Ristic Mihailo et al: "Supercapacitor Energy Storage for Magnetic Resonance Imaging Systems", IEEE Transactions On Industrial Electronics, IEEE Service Center, Piscataway, NJ, USA, vol. 61, No. 8, Aug. 1, 2014 (Aug. 1, 2014) , pp. 4255-4264.

* cited by examiner

SYSTEMS AND METHODS FOR PROVIDING OPERATING POWER TO AN MAGNETIC RESONANCE IMAGING (MRI) SYSTEM

CROSS REFERENCE TO RELATED APPLICATIONS

This application is a continuation of U.S. application Ser. No. 17/466,952, filed on Sep. 3, 2021 (now U.S. Pat. No. 11,860,255), which claims priority under 35 U.S.C. § 119 (e) to U.S. Provisional Patent Application Ser. No. 63/075,508, titled "SYSTEMS AND METHODS FOR PROVIDING OPERATING POWER TO AN MAGNETIC RESONANCE IMAGING (MRI) SYSTEM," filed on Sep. 8, 2020, each of which is incorporated by reference in its entirety herein.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

SUMMARY

Some embodiments are directed to a magnetic resonance imaging (MRI) system configured to operate in accordance with a pulse sequence having multiple periods, the MRI system comprising: a magnetics system comprising: a $B_0$ magnet; and a gradient coil; a power system configured to provide power to at least some of the magnetics system, the power system comprising: an energy storage device; and a power supply configured to receive mains electricity; and a controller configured to control the MRI system to operate in accordance with the pulse sequence at least in part by: generating, by using power supplied by the power supply and supplemental power supplied by the energy storage device, at least one gradient field using the gradient coil.

Some embodiments are directed to a power system configured to provide power to at least one component of a magnetic resonance imaging (MRI) system. The power system comprises: an energy storage device; and a power supply configured to receive mains electricity; and a controller configured to control the MRI system to operate in accordance with a pulse sequence at least in part by: generating, by using power supplied by the power supply and supplemental power supplied by the energy storage device, at least one gradient field.

In some embodiments, the energy storage device is coupled to the MRI system using a bidirectional DC-to-DC power converter. In some embodiments, the bidirectional DC-to-DC power converter comprises a synchronous buck DC-to-DC power converter, a synchronous boost DC-to-DC power converter, or a four switch buck-boost DC-to-DC power converter.

In some embodiments, the power supply is further configured to provide power to the energy storage device and the MRI system concurrently.

In some embodiments, the energy storage device is coupled to the MRI system using a unidirectional DC-to-DC power converter.

In some embodiments, the energy storage device comprises a battery. In some embodiments, the energy storage device comprises a capacitor.

In some embodiments, the energy storage device and the power supply are disposed on-board the MRI system.

In some embodiments, the pulse sequence is a diffusion-weighted imaging (DWI) pulse sequence and the gradient field is a diffusion gradient field of the DWI pulse sequence. In some embodiments, the power supply is configured to provide power and the energy storage device is configured to provide supplemental power to the MRI system during the diffusion gradient field of the DWI pulse sequence. In some embodiments, the power supply is configured to provide power and the energy storage device is configured to provide supplemental power to the MRI system at least once per period of the pulse sequence.

In some embodiments, the energy storage device and the power supply are configured to provide a peak power that is greater than or equal to 1500 W and less than or equal to 4000 W. In some embodiments, the energy storage device and the power supply are configured to provide a peak power for a length of time that is greater than or equal to 1 ms and less than or equal to 200 ms.

In some embodiments, the MRI system further comprises: a conveyance mechanism allowing the MRI system to be transported to different locations; and a transfer switch configured to couple the energy storage device to the conveyance mechanism or to the magnetics system of the MRI system.

In some embodiments, the conveyance mechanism comprises a motorized component. In some embodiments, the conveyance mechanism comprises a wheel. In some embodiments, the wheel comprises a motorized wheel.

In some embodiments, the at least one $B_0$ magnet is configured to generate a $B_0$ magnetic field having a field strength of less than or equal to approximately 0.2 T and greater than or equal to approximately 10 mT. In some embodiments, the at least one $B_0$ magnet is configured to generate a $B_0$ magnetic field having a field strength of less than or equal to approximately 0.1 T and greater than or equal to approximately 50 mT.

In some embodiments, the power supplied by the power supply and the supplemental power supplied by the energy storage device are supplied concurrently.

In some embodiments, the power supply is configured to receive single-phase mains electricity.

Some embodiments are directed to a method of operating a magnetic resonance imaging (MRI) system in accordance with a pulse sequence having multiple periods, the MRI system comprising a power supply configured to receive mains electricity and an energy storage device, the method comprising: while operating the MRI system in accordance with the pulse sequence: generating, by using power supplied by the power supply and supplemental power supplied by the energy storage device, at least one gradient field using at least one gradient coil of the MRI system.

In some embodiments, the supplemental power supplied by the energy storage device comprises power supplied from the energy storage device through a bidirectional DC-to-DC power converter.

In some embodiments, the pulse sequence is a diffusion-weighted imaging (DWI) pulse sequence.

In some embodiments, the power supplied by the power supply and the supplemental power supplied by the energy storage device comprises power having a peak power that is greater than or equal to 1500 W and less than or equal to 4000 W. In some embodiments, the power supplied by the power supply and the supplemental power supplied by the energy storage device comprises power having a total peak power for a length of time that is greater than or equal to 1 ms and less than or equal to 200 ms.

In some embodiments, generating, by using the power supplied by the power supply and the supplemental power supplied by the energy storage device, the at least one gradient field using the at least one gradient coil of the MRI system comprises generating the at least one gradient field at least once per period of the pulse sequence.

In some embodiments, the method further comprises recharging the energy storage device using the power supply.

In some embodiments, supplying the MRI system with power from the power supply and with supplemental power from the energy storage device comprises supplying the MRI system with power from the power supply and with supplemental power from a battery.

In some embodiments, supplying the MRI system with power from the power supply and with supplemental power from the energy storage device comprises supplying the MRI system with power from the power supply and with supplemental power from a capacitor.

In some embodiments, the power supply is configured to receive single-phase mains electricity.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
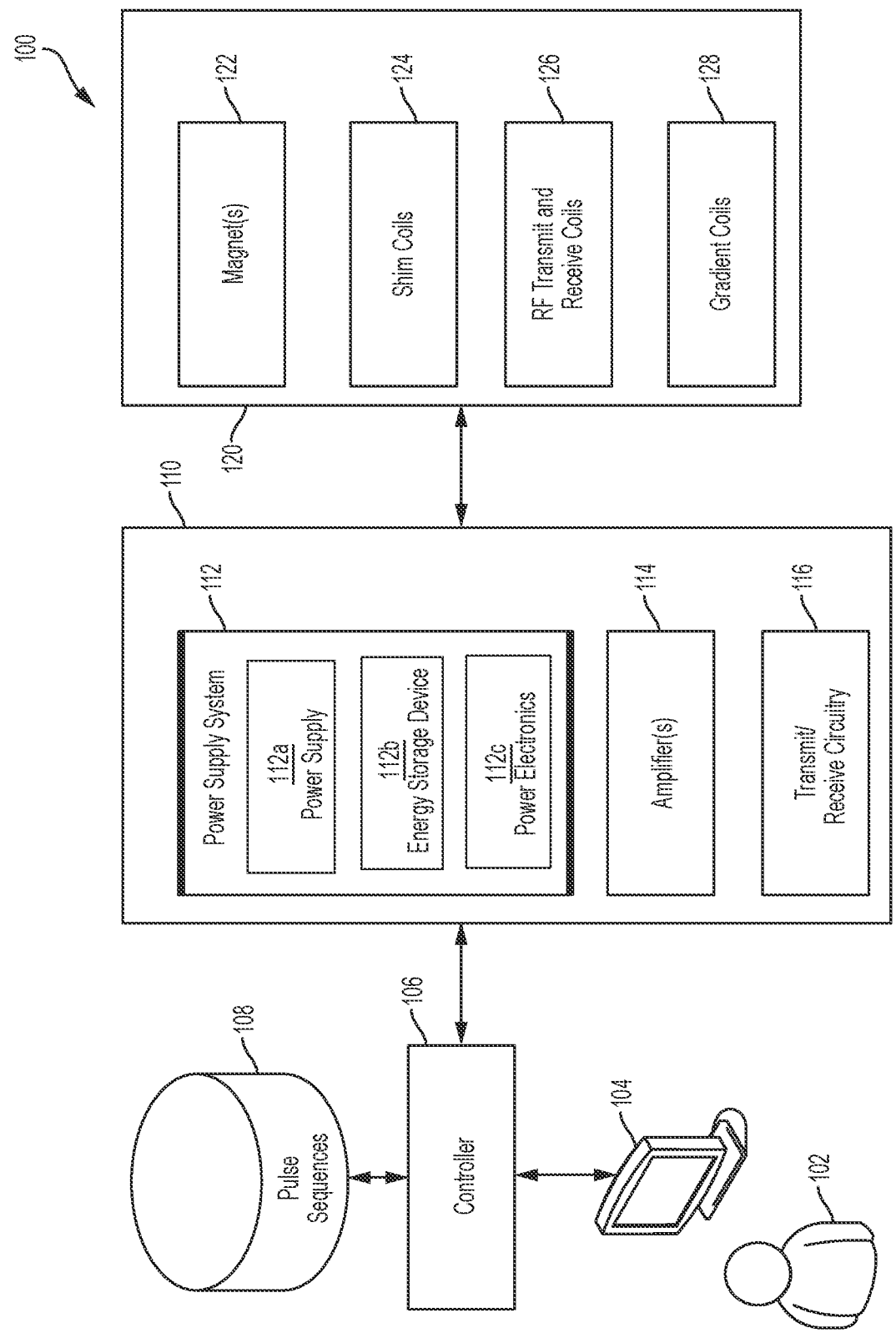
FIG. 1 illustrates exemplary components of a magnetic resonance imaging (MRI) system, in accordance with some embodiments.

Conventional MRI systems typically consume large amounts of power during their operation. For example, common 1.5 T and 3 T MRI systems typically consume between 20-40 kW of power during operation, while available 0.5 T and 0.2 T MRI systems commonly consume between 5-20 kW, each using dedicated and specialized power sources. Unless otherwise specified, power consumption is referenced as average power consumed over an interval of interest. For example, the 20-40 kW referred to above indicates the average power consumed by conventional MRI systems during the course of image acquisition, which may include relatively short periods of peak power consumption that significantly exceeds the average power consumption (e.g., when the gradient coils and/or radio frequency (RF) coils are pulsed over relatively short periods of the pulse sequence). As discussed above, available clinical MRI systems must have dedicated power sources, typically requiring a dedicated three-phase connection to the electrical grid to power the components of the MRI system in order to satisfy the peak and average power consumption during operation of the MRI system. This requirement severely limits the ability to deploy conventional clinical MRI systems in environments where such power cannot be readily supplied, restricting the clinical applications and locations where MRI can be utilized.

The inventors have recognized and appreciated that portable and/or low-field MRI systems utilizing power supplied through single-phase mains electricity also demand high peak power consumption for short periods of time during operation (e.g., to produce some gradient fields and/or RF pulses during a pulse sequence). For example, in some embodiments, while average power consumption of the MRI system may be approximately under 1500 W, for the production of some gradient fields, the MRI system may use between 2000 and 3000 W, and up to 4000 W, for a period of 100 ms. This peak power consumption may be repeated every second or two throughout operation of the MRI system. Such peak power may exceed the power that is available to the MRI system solely from mains electricity. Alternatively, when such peak power can be supplied from mains electrically, the MRI system's consumption of short bursts of high peak power could detrimentally affect the electrical system supplying the power to the MRI system. For example, if the MRI system pulls too much peak power over a short period of time, a breaker at the medical facility could be tripped during operation of the MRI system, causing undesirable loss of power at the medical facility.

The inventors have recognized and appreciated that an additional energy storage device can supplement available power provided to the MRI system by mains electricity during load peaks. Additionally, the inventors have recognized that such an energy device can provide load-leveling to the MRI system by absorbing excess power from the MRI system's mains-connected power supply (PSU) during load dips. In this manner, the MRI system can be operated without affecting the supply of mains electricity during load peaks and dips.

Accordingly, the inventors have developed systems and methods for supplying power to an MRI system from a power supply configured to receive mains electricity and supplying supplemental power to the MRI system from an energy storage device. In some embodiments, the MRI system is configured to operate in accordance with a pulse sequence having multiple periods and includes a magnetics system, a power system, and at least one controller. The magnetics system includes a $B_0$ magnet to generate at least part of (e.g., less than all of or all of) the main $B_0$ magnetic field and a gradient coil to generate at least one gradient magnetic field to provide spatial encoding of magnetic resonance (MR) signals from the subject (e.g., along the x-, y-, and/or z-axes). The power system is configured to provide power to at least some of the components of the magnetics system and includes an energy storage device and a power supply. A controller is configured to control the MRI system to operate in accordance with the pulse sequence at least in part by generating, by using power supplied by the power supply and supplemental power supplied by the energy storage device, at least one gradient field using the at least one gradient coil.

The energy storage device may be, for example, one or more batteries of any suitable chemistry, one or more capacitors, one or more supercapacitors, one or more ultracapacitors, one or more flywheels, one or more compressed fluid devices, and/or one or more pumped storage devices. It should be appreciated that the energy storage device may include a single type of energy storage device (e.g., only batteries, only capacitors, only supercapacitors, etc.) or may include any suitable combination of the above-described devices, as aspects of the technology described herein are not so limited.

The power system also includes a power supply configured to receive mains electricity. Mains electricity is electricity typically provided at standard wall outlets. Mains electricity may be single-phase electricity or may be multiphase electricity (e.g., three-phase electricity). For example, in the United States, mains electricity may be provided at a voltage of 120 V or 240 V and rated at 15, 20, or 30 amperes. Globally, mains electricity may be provided at a voltage between 100 V and 130 V (e.g., at 100 V, 110 V, 115 V, 120 V, or 127 V) or between 200 V and 240 V (e.g., at 220 V, 230 V, or 240 V) and rated at an amperage between 2.5 and 32 A. The power supply is further configured to provide power to the MRI system using the received mains electricity. For example, the power system may be an AC-to-DC power supply, in some embodiments.

In some embodiments, the MRI system may be operated using power supplied by the power supply and supplemental power supplied by the energy storage device. The power supplied by the power supply and the supplemental power supplied by the energy storage device may be jointly (e.g., concurrently, at the same time) supplied to the MRI system. For example, the energy storage device and the power supply may concurrently supply power to the MRI system for periods of time within a pulse sequence (e.g., during particular gradient and/or radio frequency pulse application periods of time). Alternatively, the power supplied by the power supply and the supplemental power supplied by the energy storage device may be nonconcurrently supplied to the MRI system (e.g., at separate times). For example, the energy storage device and the power supply may nonconcurrently supply power to the MRI system for different periods of time within a pulse sequence (e.g., for different gradient and/or radio frequency pulse application periods of time, for different portions of gradient and/or radio frequency pulse application periods of time). It should be appreciated that the supplemental power supplied by the energy storage device may provide a minority of the power used by the MRI system, approximately half of the power used by the MRI system, a majority of the power used by the MRI system, and/or all of the power used by the MRI system, as aspects of the technology described herein are not limited in this respect.

In some embodiments, the energy storage device may be electrically coupled to the MRI system (e.g., the magnetic components, other electronic components, etc.) using a unidirectional DC-to-DC power converter. In some embodiments, the energy storage device may be electrically coupled to the MRI system using a bidirectional DC-to-DC power converter. For example, the bidirectional DC-to-DC power converter may be arranged as a synchronous buck DC-to-DC power converter, a synchronous boost DC-to-DC power converter, or a four switch buck-boost DC-to-DC power converter.

In some embodiments, the power supply may be configured to provide power to the energy storage device and the MRI system concurrently. For example, the power supply may be configured to charge the energy storage device while also powering the MRI system. In some embodiments, the energy storage device may be charged by the power supply during operation of the MRI system (e.g., during a pulse sequence) or while the MRI system is in an idle state.

In some embodiments, the energy storage device and the power supply may be both physically coupled to the MRI system. In some embodiments, the energy storage device and the power supply may be both disposed on-board the MRI system. For example, in the instance of a portable MRI system that may be moved between locations, the energy storage device and the power supply may be disposed in such a way that both move with MRI system between locations.

In some embodiments, the energy storage device and the power supply may be configured to jointly provide power to the MRI system when the MRI system is operating in accordance with a particular pulse sequence. For example, the energy storage device and the power supply may be configured to jointly provide power to the MRI system when the MRI system is operating in accordance with a diffusion-weighted imaging (DWI) pulse sequence. Alternatively, the MRI system may be operated in accordance with any one of a non-limiting selection of a steady-state free precession (SSFP) pulse sequence, a balanced SSFP pulse sequence, a fluid-attenuated inversion recovery (FLAIR) pulse sequence, and/or a fast spin echo pulse sequence.

In some embodiments, the power supply may be configured to provide power to the MRI system and the energy storage device may be configured to provide supplemental power to the MRI system at least once per period of the pulse sequence (e.g., for a single pulse or multiple pulses during the pulse sequence). For example, the power supply may be configured to provide power to the MRI system and the energy storage device may be configured to provide supplemental power to the MRI system to power a gradient coil in order to generate at least one gradient field at least once per period of the pulse sequence. In some embodiments, the power supply may be configured to provide power to the MRI system and the energy storage device may be configured to provide supplemental power to the MRI system during diffusion gradient pulses of a DWI pulse sequence.

In some embodiments, the energy storage device and the power supply may be configured to provide a peak power to the MRI system that is greater than or equal to an average power used by the MRI system. For example, the energy storage device and the power supply may be configured to jointly provide a peak power that is greater than or equal to 1500 W. In some embodiments, the energy storage device and the power supply may be configured to jointly provide a peak power that is less than or equal to 4000 W. In some embodiments, the energy storage device and the power supply may be configured to jointly provide a peak power that is greater than or equal to 1500 W and less than or equal to 3500 W, greater than or equal to 1500 W and less than or equal to 3000 W, or greater than or equal to 2000 W and less than or equal to 4000 W. It may be appreciated that the energy storage device and the power supply may be configured to provide any suitable peak power or range of peak powers within the aforementioned range. In some embodiments, the energy storage device and the power supply may be configured to provide a peak power for a length of time that is greater than or equal to 1 ms and less than or equal to 200 ms, greater than or equal to 1 ms and less than or equal to 150 ms, greater than or equal to 5 ms and less than or equal to 150 ms, or greater than or equal to 10 ms and less than or equal to 100 ms.

In some embodiments, the MRI system may also include a conveyance mechanism allowing the MRI system to be transported to different locations. For example, the conveyance mechanism may be a motorized drive system, in some embodiments. The MRI system may also include a transfer switch configured to couple the energy storage device to the mobile MRI drive system or to the magnetics system of the MRI system. In this way, the energy storage device may be used to power the conveyance mechanism while the MRI system is moving between locations and not connected to mains electricity (e.g., via a wall outlet). In some embodiments, the conveyance mechanism may include at least one motorized component. In some embodiments, the conveyance mechanism may include at least one wheel. For example, the at least one wheel may be at least one motorized wheel.

In some embodiments, the at least one $B_0$ magnet is configured to generate a $B_0$ magnetic field having a field strength of less than or equal to 0.2 T. In some embodiments, the at least one $B_0$ magnet is configured to generate a $B_0$ magnetic field having a field strength of less than or equal to 0.2 T and greater than or equal to 50 mT, a field strength of less than or equal to 0.1 T and greater than or equal to 50 mT, a field strength of less than or equal to 0.1 T and greater than or equal to 10 mT, a field strength of less than or equal to 0.1 T and greater than or equal to 20 mT, a field strength of less than or equal to 0.1 T and greater than or equal to 0.05 mT, a field strength of less than or equal to 0.2 T or greater than or equal to 20 mT, or field strength within any suitable range within these ranges.

It should be appreciated that while the techniques described herein are described primarily in connection with an MRI system, they could be employed in other similar medical imaging devices requiring large peak power during operation, such as X-ray scanners and/or CT scanners. Following below are more detailed descriptions of various concepts related to, and embodiments of, techniques for load-leveling of a medical imaging system. It should be appreciated that various aspects described herein may be implemented in any of numerous ways. Examples of specific implementations are provided herein for illustrative purposes only. In addition, the various aspects described in the embodiments below may be used alone or in any combination and arc not limited to the combinations described explicitly herein.

As used herein, "high-field" refers generally to MRI systems presently in use in a clinical setting and, more particularly, to MRI systems operating with a main magnetic field (i.e., a $B_0$ field) al or above 1.5 T, though clinical systems operating between 0.5 T and 1.5 T are often also characterized as "high-field." Field strengths between 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to 0.2 T. For example, a low-field MRI system may operate with a $B_0$ field having a field strength of less than or equal to 0.2 T and greater than or equal to 50 mT, having a field strength of less than or equal to 0.1 T and greater than or equal to 50 mT, a field strength of less than or equal to 0.1 T and greater than or equal to 10 mT, a field strength of less than or equal to 0.1 T and greater than or equal to 20 mT, a field strength of less than or equal to 0.1 T and greater than or equal to 0.05 mT, a field strength of less than or equal to 0.2 T or greater than or equal to 20 mT, or field strength within any suitable range within these ranges.

FIG. 1 illustrates exemplary components of a magnetic resonance imaging (MRI) system, in accordance with some embodiments. In the illustrative example of FIG. 1, MRI system 100 comprises computing device 104, controller 106, pulse sequences repository 108, power management system 110, and magnetics components 120. It should be appreciated that system 100 is illustrative and that an MRI system may have one or more other components of any suitable type in addition to or instead of the components illustrated in FIG. 1. However, an MRI system will generally include these high-level components, though the implementation of these components for a particular MRI system may differ. It may be appreciated that the techniques described herein for detecting patient motion may be used with any suitable type of MRI systems including high-field MRI systems, low-field MRI systems, and ultra-low field MRI systems. For example, the techniques described herein may be used with any of the MRI systems described herein and/or as described in U.S. Pat. No. 10,627,464 filed Jun. 30, 2017 and titled "Low-Field Magnetic Resonance Imaging Methods and Apparatus," which is incorporated by reference herein in its entirety.

As illustrated in FIG. 1, magnetics components 120 comprise $B_0$ magnets 122, shim coils 124, RF transmit and receive coils 126, and gradient coils 128. $B_0$ magnets 122 may be used to generate the main magnetic field $B_0$. $B_0$ magnets 122 may be any suitable type or combination of magnetics components that can generate a desired main magnetic $B_0$ field. In some embodiments, $B_0$ magnets 122 may be one or more permanent magnets, one or more electromagnets, one or more superconducting magnets, or a hybrid magnet comprising one or more permanent magnets and one or more electromagnets and/or one or more superconducting magnets. In some embodiments, $B_0$ magnets 122 may be configured to generate a $B_0$ magnetic field having a field strength that is less than or equal to 0.2 T, a field strength of less than or equal to 0.2 T and greater than or equal to 50 mT, a field strength of less than or equal to 0.1 T and greater than or equal to 50 mT, a field strength of less than or equal to 0.1 T and greater than or equal to 10 mT, a field strength of less than or equal to 0.1 T and greater than or equal to 20 mT, a field strength of less than or equal to 0.1 T and greater than or equal to 0.05 mT, a field strength of less than or equal to 0.2 T or greater than or equal to 20 mT, or field strength within any suitable range within these ranges.

For example, in some embodiments, $B_0$ magnets 122 may include a first and second $B_0$ magnet, each of the first and second $B_0$ magnet including permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets. As an example, $B_0$ magnets 122 may include an upper magnet 810a and a lower magnet 810b as described in the embodiment shown in FIGS. 8A and 8B herein. Each magnet 810a, 810b includes permanent magnet blocks arranged in concentric rings about a common center, and the upper magnet 810a and lower magnet 810b are arranged in a bi-planar configuration and supported by ferromagnetic yoke 820. Additional details of such embodiments are described in U.S. Pat. No. 10,545,207 titled "Low-Field magnetic Resonance Imaging Methods and Apparatus" filed on Apr. 18, 2018, which is incorporated by reference herein in its entirety.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by $B_0$ magnets 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. In some embodiments, gradient coils 128 may be implemented using laminate panels (e.g., printed circuit boards). Examples of such gradient coils are described in U.S. Pat. No. 9,817,093 titled "Low Field Magnetic Resonance Imaging Methods and Apparatus" filed on Sep. 4, 2015, which is incorporated by reference herein in its entirety.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive circuitry 116 comprises one or more transmit coils that may be used to generate RF pulses to induce an oscillating magnetic field $B_1$. The transmit coil(s) may be configured to generate any suitable types of RF pulses. The transmit and receive circuitry 116 may include additional electronic components of the transmit and receive chains, as described in U.S. Patent Application Publication No. 2019/0353723 titled "Radio-Frequency Coil Signal Chain for a Low-Field MRI System" and filed on May 21, 2019, which is hereby incorporated by reference in its entirety.

Power management system 110 includes electronics to provide operating power to one or more components of the low-field MRI system 100. For example, power management system 110 may include one or more power supplies, energy storage devices, gradient power components, transmit coil components, and/or any other suitable power electronics needed to provide suitable operating power to energize and operate components of MRI system 100. As illustrated in FIG. 1, power management system 110 comprises power supply system 112, power component(s) 114, transmit/receive switch 116, and thermal management components 118 (e.g., cryogenic cooling equipment for superconducting magnets).

Power supply system 112 includes electronics to provide operating power to magnetic components 120 of the MRI system 100. The electronics of power supply system 112 may provide, for example, operating power to one or more gradient coils (e.g., gradient coils 128) to generate one or more gradient magnetic fields to provide spatial encoding of the MR signals. For example, power supply system 112 may include a power supply 112a configured to provide power from mains electricity to the MRI system and an energy storage device 112b, as described in more detail in connection with FIGS. 2A and 2B. The power supply 112a may, in some embodiments, be an AC-to-DC power supply configured to convert AC power from mains electricity into DC power for use by the MRI system. The energy storage device 112b may, in some embodiments, be any one of a battery, a capacitor, a supercapacitor, an ultracapacitor, a flywheel, or any other suitable energy storage apparatus that may bidirectionally receive (e.g., store) power from mains electricity and supply power to the MRI system. Additionally, power supply system 112 may include power electronics 112c encompassing components including, but not limited to, power converters, switches, buses, drivers, and any other suitable electronics for supplying the MRI system with power.

In some embodiments, the power supply system 112 may be configured to receive operating power from mains electricity via a power connection to, for example, a standard wall outlet (e.g., 120V/20 A connections in the United States, 100-130V/200-240V connections internationally) or common large appliance outlets (e.g., 220-240V/30 A), allowing the device to be operated anywhere common power outlets are provided. For example, mains electrical power in the United States and most of North America is provided at 120V and 60 Hz and rated at 15 or 20 amps, permitting utilization for devices operating below 1800 and 2400 W, respectively. Many facilities also have 220-240 VAC outlets with 30 amp ratings, permitting devices operating up to 7200

W to be powered from such outlets. The ability to "plug into the wall" facilitates both portable/transportable MRI as well as fixed MRI system installations without requiring special, dedicated power such as a three-phase power connection.

Amplifiers(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124). Transmit/receive switch 116 may be used to select whether RF transmit coils or RF receive coils are being operated.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be located in a same room as the MRI system 100 and/or coupled to the MRI system 100. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect.

Figure 2A:
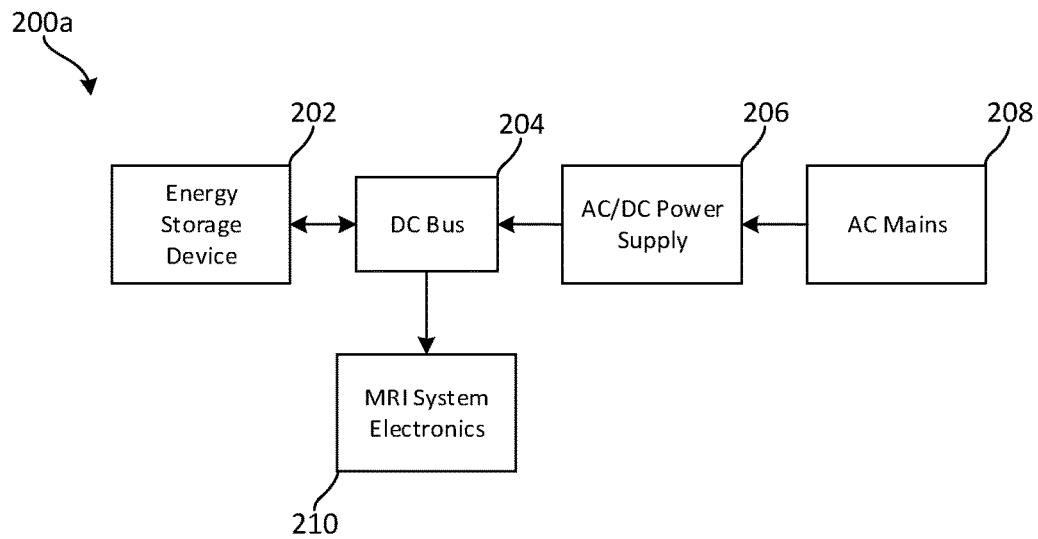
FIG. 2A illustrates a block diagram of an exemplary power system for an MRI system, in accordance with some embodiments.

FIG. 2A illustrates a block diagram of an exemplary power system 200a for an MRI system, in accordance with some embodiments. Power system 200a may be included in power supply system 112 as described in connection with FIG. 1. Power system 200a includes an energy storage device 202 and an AC-to-DC power supply 206 electrically coupled to the MRI system electronics 210 (e.g., to one or more components of magnetics system 120 (e.g., $B_0$ magnet(s) 122, shim coils 124, RF transmit and receive coils 126, and/or gradient coils 128) and/or to any other MRI system electronics to be powered during operation) through DC bus 204. The AC-to-DC power supply 206 receives mains electricity (e.g., single-phase electricity) from AC mains 208 (e.g., a wall outlet).

In some embodiments, the energy storage device 202 may comprise a physical system configured to store energy and exchange energy in both directions with an electrical circuit. The energy storage device 202 may include, for example, one or more batteries of any suitable chemistry. For example, the energy storage device 202 may be lead-acid batteries, nickel-cadmium batteries, nickel-metal hydride batteries, and/or lithium ion batteries. Alternatively or additionally, the energy storage device 202 may include one or more capacitors, supercapacitors, or ultracapacitors (e.g., comprising a capacitance greater than or equal to 0.5 F). Alternatively or additionally, the energy storage device 202 may include any other suitable energy storage mechanism, including but not limited to a flywheel, compressed fluids, and/or pumped storage.

In some embodiments, the AC-to-DC power supply 206 may convert AC mains electricity to DC power to supply the MRI system electronics 210 with DC power through the DC bus 204. The AC-to-DC power supply 206 may comprise a transformer and a rectifier. The AC-to-DC power supply 206 may include any other suitable components. For example, the AC-to-DC power supply 206 may include additional filtering components based on requirements of the MRI system electronics 210 to filter AC noise out of the DC signal.

In some embodiments, the AC-to-DC power supply 206 may be configured to provide power to MRI system electronics 210 and the energy storage device 202 may be configured to provide supplemental power to MRI system electronics 210 during operation of the MRI system. For example, the AC-to-DC power supply 206 may be configured to provide power to MRI system electronics 210 and the energy storage device 202 may be configured to provide supplemental power to MRI system electronics 210 when the MRI system electronics 210 are operated in accordance with a pulse sequence having multiple periods in order to acquire a magnetic resonance (MR) image. The AC-to-DC power supply 206 may be configured to provide power to MRI system electronics 210 and the energy storage device 202 may be configured to provide supplemental power to MRI system electronics 210 for portions of or the entirety of a period of the pulse sequence.

In some embodiments, the AC-to-DC power supply 206 may be configured to provide power to MRI system electronics 210 and the energy storage device 202 may be configured to provide supplemental power to MRI system electronics 210 during operation of the MRI system in accordance with a diffusion-weighted imaging (DWI) pulse sequence. DWI pulse sequences use strong diffusion gradient fields to sensitize diffusing spins (e.g., in the blood stream, in cerebrospinal fluid, in tumors, etc.) and to generate MR images based on the diffusion of the sensitized spins. In some embodiments, the AC-to-DC power supply 206 may be configured to provide power to MRI system electronics 210 and the energy storage device 202 may be configured to provide supplemental power to MRI system electronics 210 when diffusion gradient fields are being generated by the gradient coils of the MRI system during a DWI pulse sequence.

In some embodiments, the energy storage device 202 and the AC-to-DC power supply 206 may be configured to provide a peak power having an amplitude greater than an average power consumption of the MRI system. For example, the energy storage device 202 and the AC-to-DC power supply 206 may be configured to provide a peak power having an amplitude greater than or equal to 1500 W. In some embodiments, the energy storage device 202 and the AC-to-DC power supply 206 may be configured to provide a peak power having an amplitude less than or equal to 4000 W. In some embodiments, the energy storage device and the power supply may be configured to provide a peak power that is greater than or equal to 1500 W and less than or equal to 3500 W, greater than or equal to 1500 W and less than or equal to 3000 W, or greater than or equal to 2000 W and less than or equal to 4000 W. It may be appreciated that in some embodiments, the energy storage device 202 and the AC-to-DC power supply 206 may be configured to provide any suitable peak power having an amplitude within the above-specified range or a range of peak powers within that range.

In some embodiments, the energy storage device 202 and the AC-to-DC power supply 206 may be configured to function as an uninterruptible power supply (UPS). For example, in the event that the AC mains electricity is interrupted (e.g., a blackout or a brownout), the energy storage device 202 may be configured to supply additional power to the MRI system electronics 210 in order to maintain a steady power supply to the MRI system electronics 210. In particular, such a configuration would be useful in settings where the electrical infrastructure is unreliable (e.g., field hospitals, the developing world).

In some embodiments, the energy storage device 202 and the AC-to-DC power supply 206 may both be physically coupled to the MRI system. For example, the energy storage device 202 and the AC-to-DC power supply 206 may both be "on-board" the MRI system such that if the MRI system is moved between locations, both the energy storage device 202 and the AC-to-DC power supply 206 are moved with the MRI system.

Figure 2B:
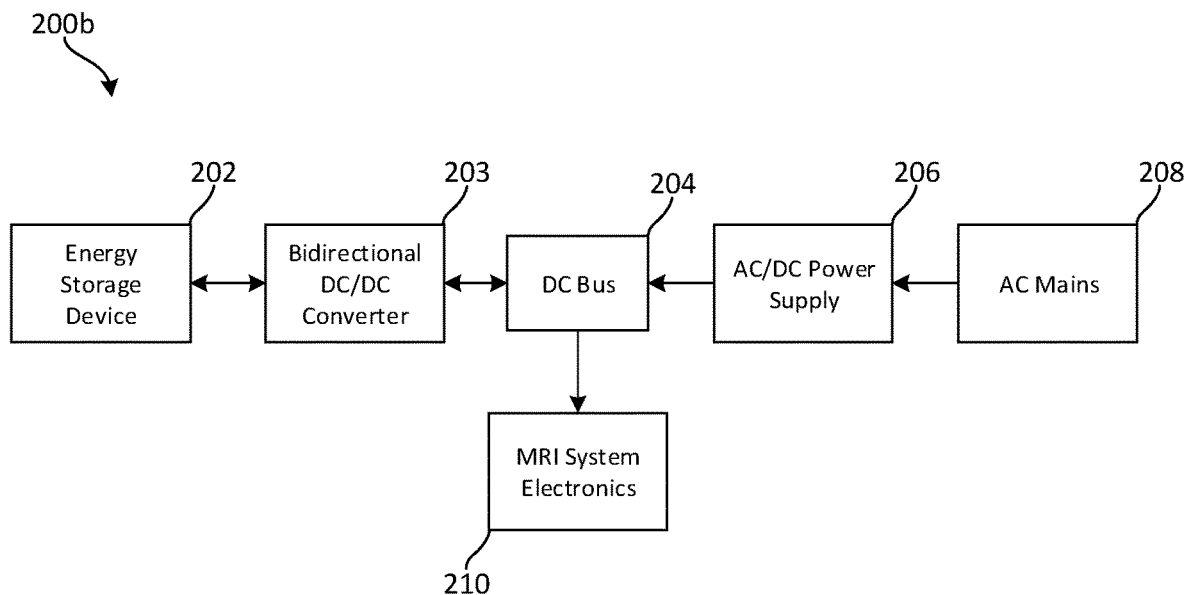
FIG. 2B illustrates a block diagram of an exemplary power system for an MRI system including a bidirectional DC-to-DC power converter, in accordance with some embodiments.

Additional configurations of energy storage device 202 and AC-to-DC power supply 206 are presented herein. FIG. 2B illustrates a block diagram of an exemplary power system 200b for an MRI system, in accordance with some embodiments. The energy storage device 202 may be coupled to the DC bus 204 through a bidirectional DC-to-DC power converter 203. In some embodiments, the bidirectional DC-to-DC power converter 203 may comprise a synchronous buck DC-to-DC power converter, a synchronous boost DC-to-DC power converter, or a four switch buck-boost DC-to-DC power converter, as described in more detail in connection with FIGS. 3A-3C. In some embodiments, the bidirectional DC-to-DC power converter 203 may comprise a switch-mode power supply (SMPS).

In some embodiments, the bidirectional DC-to-DC power converter 203 may switch between buck and boost modes based on the voltage of the DC bus 204. For example, at the start of a pulse sequence and when a load on the AC-to-DC power supply 206 is light, the DC bus 204 may maintain its nominal output voltage, $V_{BUS}$. At this stage, the bidirectional DC-to-DC power converter 203 operates in buck mode and acts as a float charger for the energy storage device 202. As the pulse sequence progresses and the load on the AC-to-DC power supply 206 exceeds the current limit of the AC-to-DC power supply 206, the value of $V_{BUS}$ begins to decrease. When $V_{BUS}$ falls below a threshold voltage value, the bidirectional DC-to-DC power converter 203 is switched into boost mode (e.g., by controller 106, by MRI system electronics 210, etc.), thereby causing the energy storage device 202 to provide current to the AC-to-DC power supply 206 and to regulate the value of $V_{BUS}$. When the excess load on the AC-to-DC power supply 206 decreases and $V_{BUS}$ begins to rise (e.g., after a large gradient pulse is completed), the bidirectional DC-to-DC power converter 203 will be switched back to operating in buck mode once $V_{BUS}$ has remained above a threshold voltage level for a specified length of time (e.g., 50 μs). In some embodiments, boost mode may also be automatically terminated after a specified length of time (e.g., 200 ms) or if the voltage of the energy storage device 202 falls below a threshold value.

In some embodiments, coupling the energy storage device 202 to the DC bus 204 through the bidirectional DC-to-DC power converter 203 may allow the energy storage device 202 to exchange energy with the DC bus 204 while allowing the energy storage device 202 and the DC bus 204 to maintain arbitrary and different DC voltages. For example, if the energy storage device 202 comprises a 1 F capacitor rated up to 60V (e.g., it can store 1800 J of energy) and is directly connected to the DC bus 204, which is maintained at 48V, the energy storage device 202 may store only up to 1152 J of energy. However, if the energy storage device 202 is coupled to the same DC bus 204 through the bidirectional DC-to-DC power converter 203, the energy storage device 202 may be charged up to 60V (e.g., its full 1800 J of energy) while still maintaining the DC bus 204 at a lower 48V nominal level.

The implementation of the bidirectional DC-to-DC power converter 203 may include any combination of component arrangements (e.g., a synchronous boost converter, a synchronous buck converter, and/or a four switch buck-boost converter). Some examples of DC-to-DC power converters that may be used in the power system 200b are shown in FIGS. 3A-3C and described below.

Figure 3A:
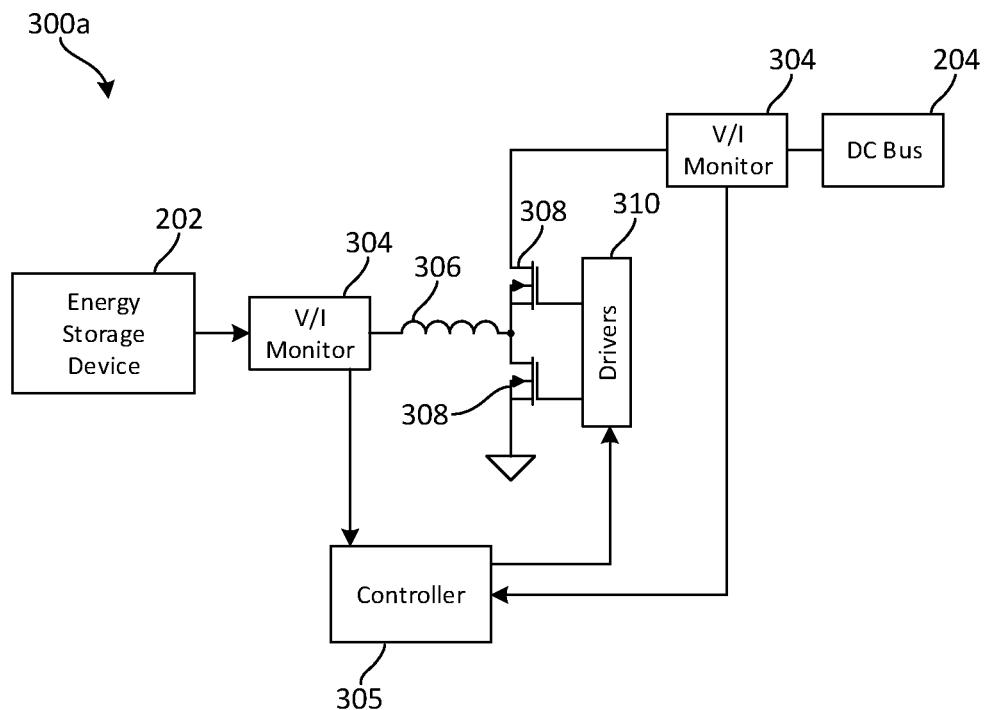
FIG. 3A illustrates a block diagram of a first exemplary bidirectional DC-to-DC power converter for a power system including an energy storage device having a voltage that is lower than the bus voltage, in accordance with some embodiments.
Figure 3B:
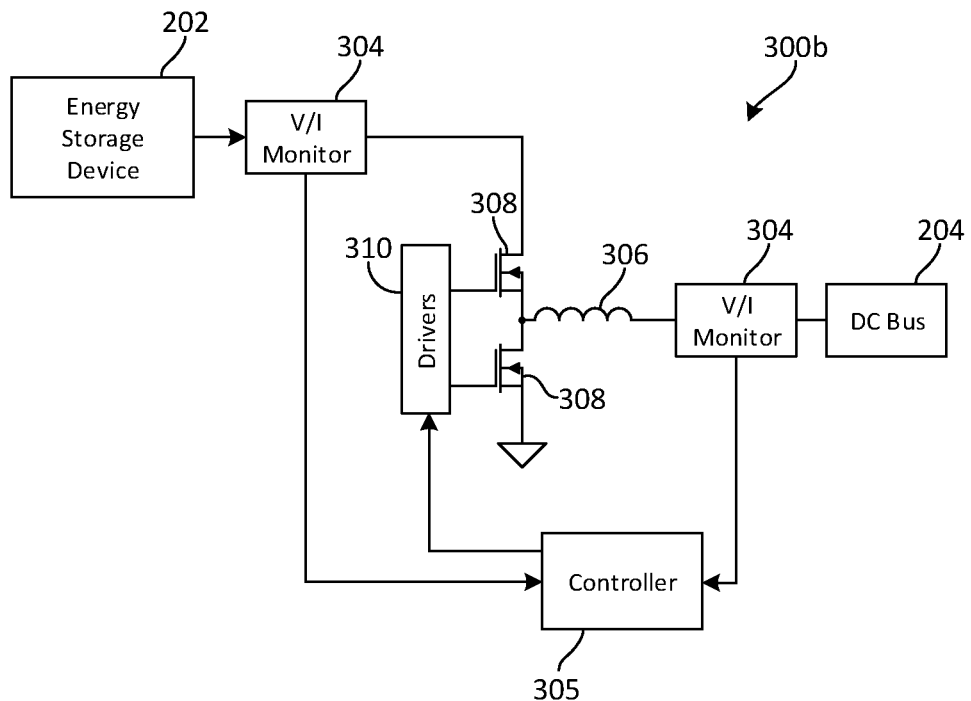
FIG. 3B illustrates a block diagram of a second exemplary bidirectional DC-to-DC power converter for a power system including an energy storage device having a voltage that is higher than the bus voltage, in accordance with some embodiments.
Figure 3C:
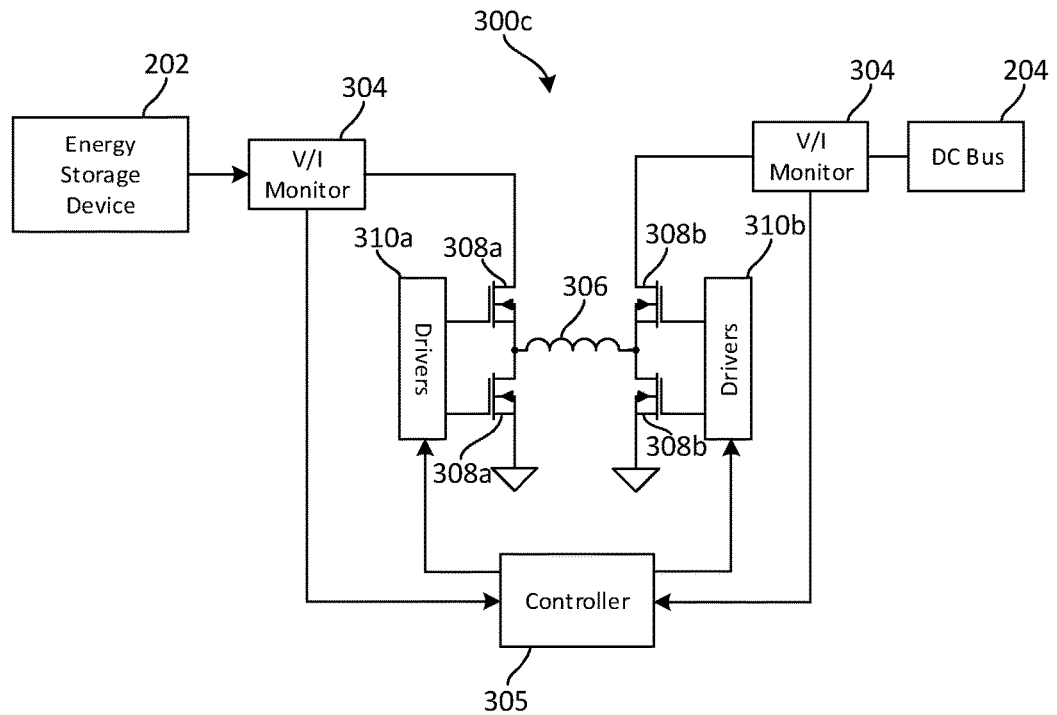
FIG. 3C illustrates a block diagram of a third exemplary bidirectional DC-to-DC power converter for a power system including an energy storage device having a voltage that may be higher or lower than the bus voltage, in accordance with some embodiments.

FIG. 3A illustrates a block diagram of an exemplary DC-to-DC power converter 300a, in accordance with some embodiments. The energy storage device 202 may be configured to have an operating voltage that is lower than the nominal voltage of the DC bus 204. For example, the energy storage device 202 may be a 24V rechargeable battery while the DC bus 204 may be maintained at 48V. The DC-to-DC power converter 300a may be configured to function as a step-down converter when delivering power to the energy storage device 202 (e.g., to charge the energy storage device 202) and to function as a step-up converter when extracting power from the energy storage device 202 to deliver it to the DC bus 204.

The DC-to-DC power converter 300a may include V/I monitors 304 to monitor the voltage and/or current flow from energy storage device 202 and the DC bus 204 and to determine the direction and magnitude of power flow at any given time, in some embodiments. A controller 305 may receive information indicative of a voltage and/or current flow into or out of the energy storage device 202 and/or the DC bus 204 from V/I monitors 304. The controller 305 may also receive information from another controller (e.g., controller 106 of FIG. 1) including instructions to change current direction and/or amplitude. In some embodiments, the controller may include, for example, a microcontroller.

The DC-to-DC power converter 300a may include an inductor 306 coupled between the source and drain of transistor switches 308 and the energy storage device 202, in some embodiments. In some embodiments, the controller 305 may send instructions to drivers 310 to enable or disable transistor switches 308, allowing current to flow to or from the energy storage device 202 through inductor 306.

FIG. 3B illustrates a block diagram of another exemplary DC-to-DC power converter 300b, in accordance with some embodiments. The energy storage device 202 may be configured to have an operating voltage that is higher than the nominal voltage of the DC bus 204. For example, the energy storage device 202 may be a capacitor (e.g., a 600V film capacitor) while the DC bus 204 may be maintained at 48V. The DC-to-DC power converter 300b may be configured to function as a step-down converter when extracting power from the energy storage device 202 to deliver it to the DC bus 204 and to function as a step-up converter when delivering power to the energy storage device 202 (e.g., to charge the energy storage device 202).

The DC-to-DC power converter 300b may include same or similar components as the DC-to-DC power converter 300a but may couple an output of the energy storage device 202 to a transistor switch 308 rather than the inductor 306, in some embodiments. The inductor 306 may be coupled between the source and drain of the transistor switches 308 and the DC bus 204. In some embodiments, the controller 305 may send instructions to drivers 310 to enable or disable transistor switches 308, allowing current to flow to or from the energy storage device 202 through inductor 306.

FIG. 3C illustrates a block diagram of another exemplary DC-to-DC power converter 300c, in accordance with some embodiments. The energy storage device 202 may be configured to vary above and below the nominal operating voltage of the DC bus 204. For example, the energy storage device 202 may comprise an array of supercapacitors (e.g., an array providing a total voltage of 18V and capacitance of 62F). In such embodiments, DC-to-DC power convener 300c may function as either a step-up or step-down converter when transferring power in either direction between the energy storage device 202 and the DC bus 204.

The DC-to-DC power converter 300c may include two pairs of transistor switches 308a and 308b and two drivers 310a and 310b, respectively, to control the states of the transistor switches 308a and 308b, in some embodiments. The controller 305 may send instructions to both drivers 310a and 310b in order to change the states of the transistor switches 308a and 308b in order to, for example, change direction of current flow between the energy storage device 202 and the DC bus 204. An inductor 306 may be coupled between the pairs of transistor switches 308a and 308b such that it is coupled between a source and a drain of both pairs of transistor switches 308a and 308b.

Figure 4:
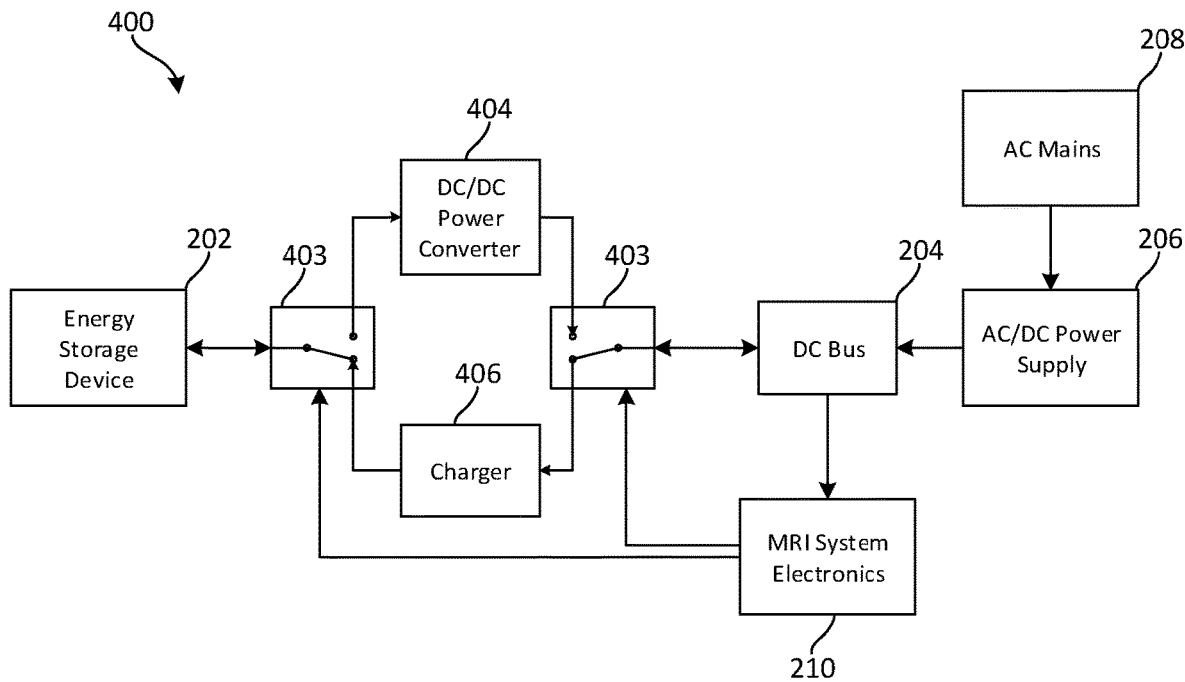
FIG. 4 illustrates a block diagram of an exemplary power system for an MRI system including unidirectional DC-to-DC power converters, in accordance with some embodiments.

FIG. 4 is an illustrative block diagram of a power system 400 for an MRI system including unidirectional DC-to-DC power converters 404 and 406, in accordance with some embodiments. The energy storage device 202 may be coupled to the DC Bus 204 through transfer switches 403 and first DC-to-DC power converter 404 or second DC-to-DC power converter 406. For example, first DC-to-DC power converter 404 may be configured to transfer power from the energy storage device 202 to the DC bus 204 while second DC-to-DC power converter 406 may be configured to transfer power from the DC bus 204 to the energy storage device 202.

In some embodiments, transfer switches 403 may be configured to couple the energy storage device 202 to the DC Bus 204 either through the DC-to-DC power converter 404 or the DC-to-DC power converter 406 depending on the desired direction of power transfer between the energy storage device 202 and the DC bus 204. As shown in the example of FIG. 4, the MRI system electronics 210 may be communicatively coupled to the transfer switches 403 and may control and/or send information indicative of desired settings of the transfer switches 403 based on the desired direction of power transfer between the energy storage device 202 and the DC bus 204. For example, the transfer switches may be electronic relay switches that may be operated using an electrical signal. In some embodiments, the transfer switches may be manual switches that may be switched by, for example, a user of the MRI system.

In some embodiments, the energy storage device 202 may additionally be configured to power a conveyance mechanism to enable portability of the MRI system. For example, the conveyance mechanism may comprise a motor coupled to one or more drive wheels to provide motorized assistance in transporting the MRI system between locations. Additional aspects of a portable MRI system are described in U.S. Pat. No. 10,222,434, titled "Portable Magnetic Resonance Imaging Methods and Apparatus" and filed on Jan. 24, 2018, which is hereby incorporated by reference in its entirety.

Figure 5:
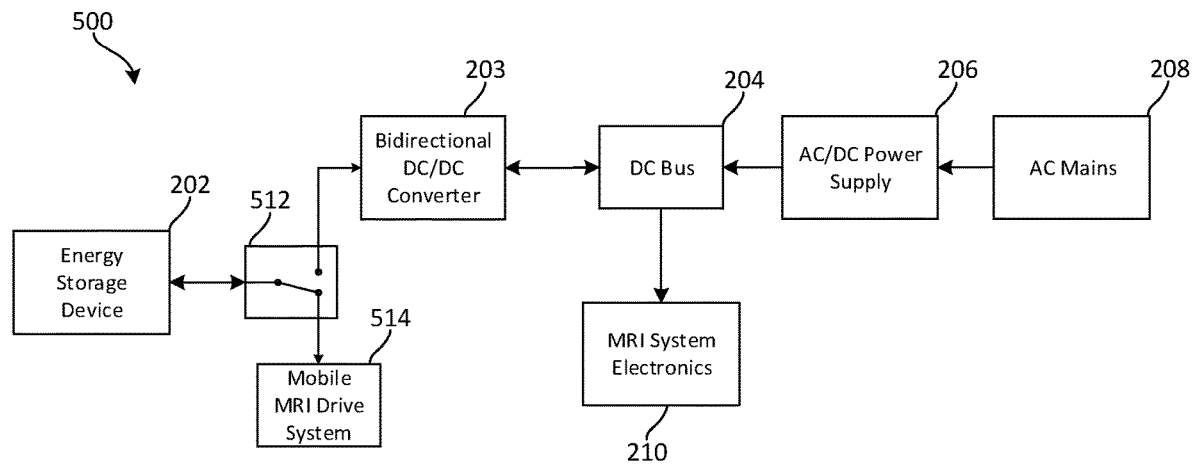
FIG. 5 illustrates a block diagram of an exemplary power system for a portable MRI system including a motorized drive system, in accordance with some embodiments.

FIG. 5 illustrates a block diagram of an exemplary power system 500 for a portable MRI system, in accordance with some embodiments. A transfer switch 512 may couple the energy storage device 202 to either the DC bus 204 to power the MRI system electronics 210 or to the mobile MRI drive system 514. The mobile MRI drive system 514 may include a motorized component configured to assist in moving the MRI system between locations, as described in connection with FIGS. 8A and 8B.

Figure 6:
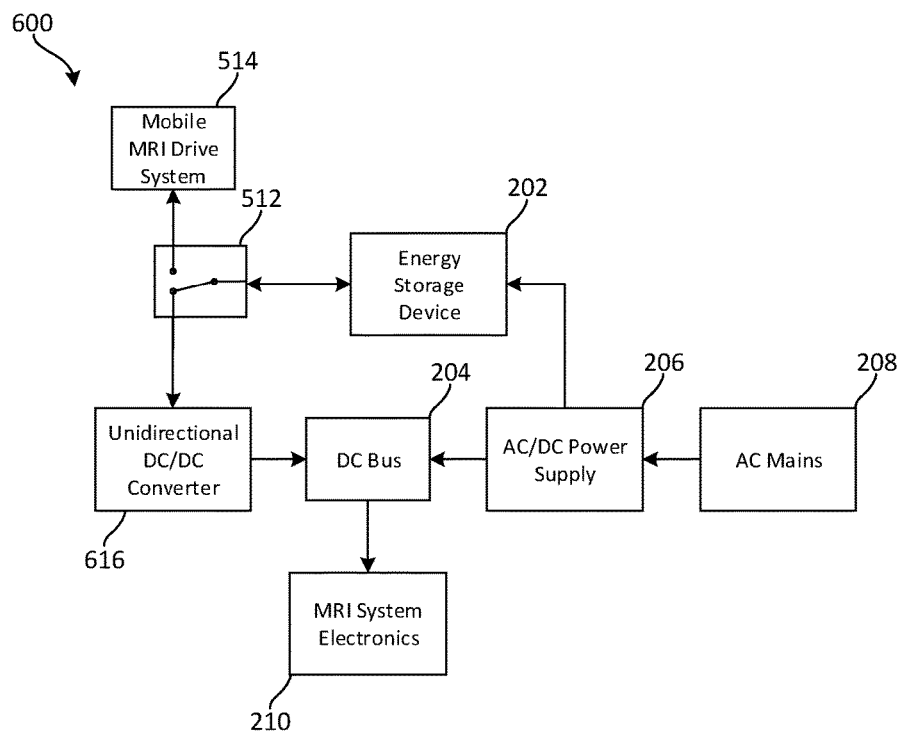
FIG. 6 illustrates a block diagram of another exemplary power system for a portable MRI system including a motorized drive system, in accordance with some embodiments.

FIG. 6 illustrates a block diagram of another exemplary power system 600 for a portable MRI system, in accordance with some embodiments. The AC-to-DC power supply 206 may power the energy storage device 202, and an output of the energy storage device 202 may be coupled between the DC bus 204 or the mobile MRI drive system 514 by a transfer switch 512. In such embodiments, the energy storage device 202, when coupled to the DC bus 204, may be coupled to the DC bus 204 through a unidirectional DC-to-DC power converter 616.

Figure 7:
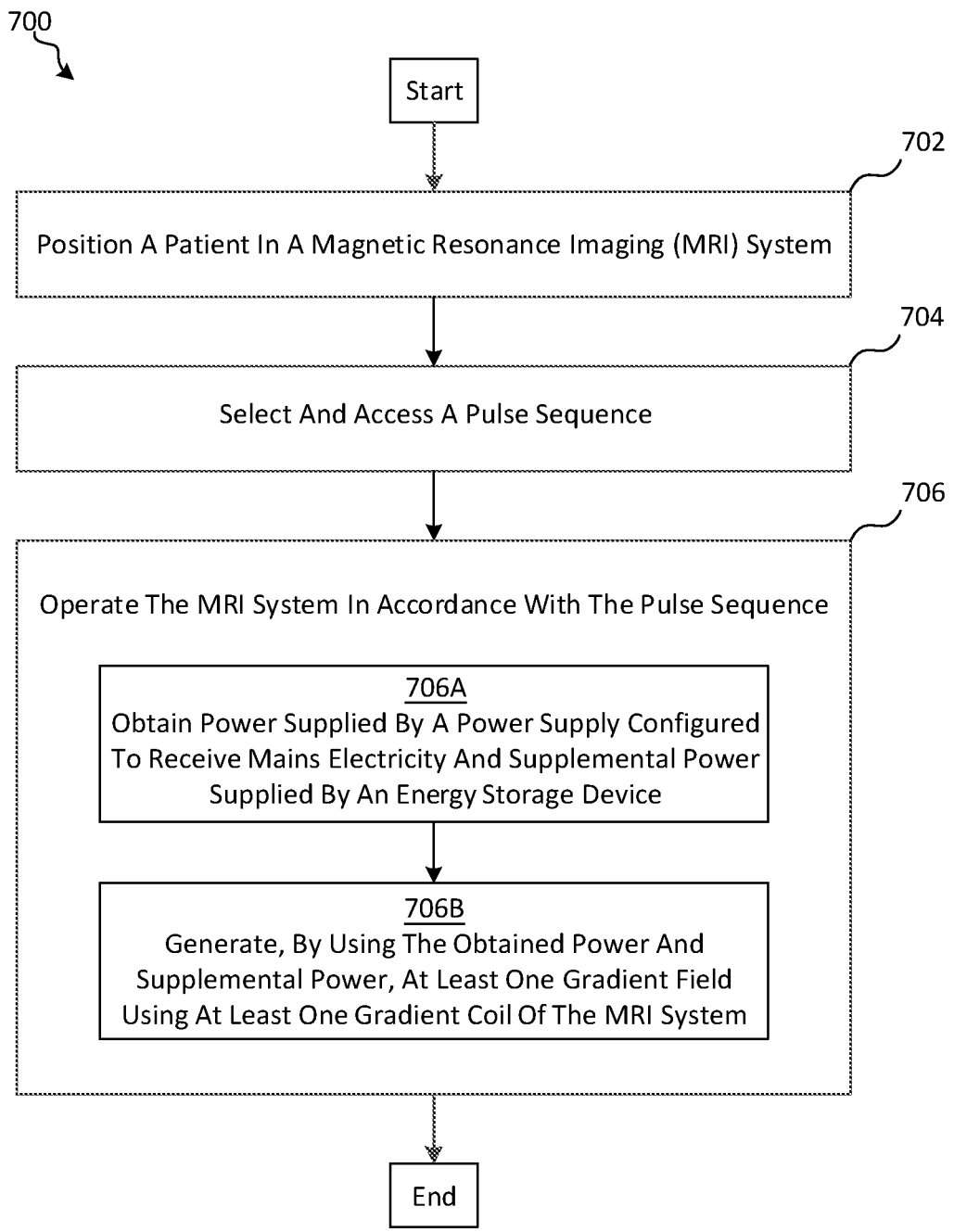
FIG. 7 is a flowchart of an illustrative process 700 for operating an MRI system, in accordance with some embodiments.

FIG. 7 is a flowchart of an illustrative process 700 for operating an MRI system, in accordance with some embodiments. Process 700 may be performed, at least in part, by any suitable computing device(s). For example, process 700 may be performed by one or more processors that are a part of the MRI system and/or by one or more processors external to the MRI system (e.g., computing devices in an adjoining room, computing devices elsewhere in a medical facility, and/or on the cloud).

Figure 9:
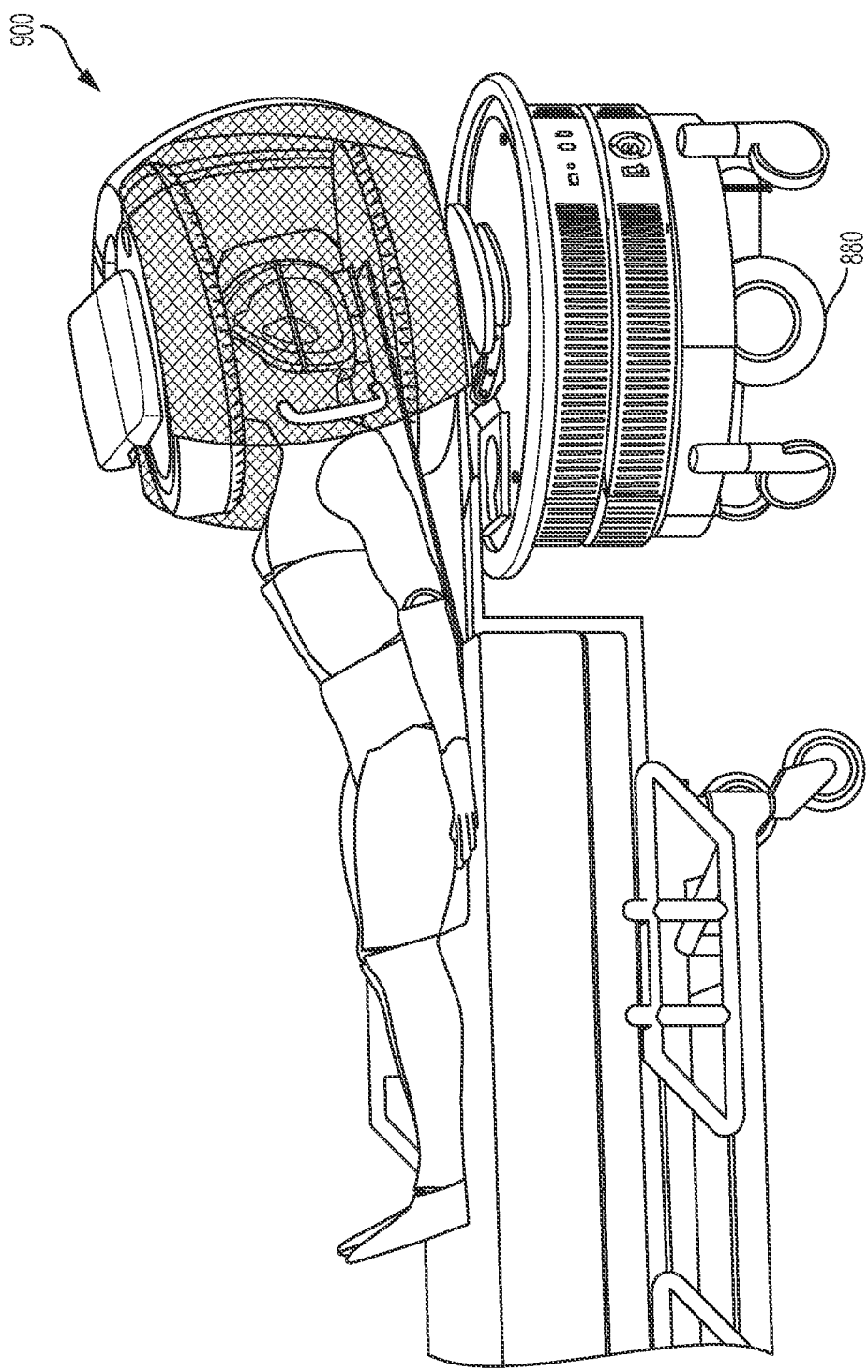
FIG. 9 illustrates a portable MRI system performing a scan of a patient's head, in accordance with some embodiments.

Process 700 begins at act 702, where a patient may be positioned in the MRI system, in some embodiments. The patient may be positioned so that the portion of the patient's anatomy that is to be imaged is placed within an imaging region of the MRI system. For example, as shown in the example of FIG. 9, the patient's head may be positioned within the imaging region of the MRI system in order to obtain one or more images of the patient's brain.

Next, process 700 proceeds to act 704, where a pulse sequence may be selected and accessed. The pulse sequence may be selected based on input from a user of the MRI system that is entered into a controller of the MRI system. For example, the user may input information about the patient (e.g., what portion of the patient's anatomy is positioned within the MRI system, what information the user would like to collect about the patient), and the controller may select an appropriate pulse sequence based on that input. Alternatively or additionally, the user may directly select a desired pulse sequence within a user interface of the controller. For example, the user may select a diffusion weighted imaging (DWI) pulse sequence for imaging of the patient. Alternatively, the user may select any one of a non-limiting selection of a steady-state free precession (SSFP) pulse sequence, a balanced SSFP pulse sequence, a fluid-attenuated inversion recovery (FLAIR) pulse sequence, and/or a fast spin echo (FSE) pulse sequence.

In some embodiments, the pulse sequence may be accessed by the controller in order to operate the MRI system in accordance with the pulse sequence. The pulse sequence may be stored electronically (e.g., in at least one computer readable memory, for example, in a text file or in a database). In some embodiments, storing a pulse sequence may comprise storing one or more parameters defining a pulse sequence (e.g., timing sequences, gradient field strengths and directions, radio frequency pulse strengths and/or operating frequencies). It should be appreciated that a pulse sequence may be stored in any suitable way and in any suitable format, as aspects of the technology described herein are not limited in this respect. For example, the pulse sequence may be accessed from pulse sequences 108 by controller 106, as described in connection with FIG. 1 herein.

Process 700 may then proceed to act 706, in which the MRI system may be operated in accordance with the selected pulse sequence, in some embodiments. Act 706 may include at least two sub-acts. 706A and 706B. In sub-act 706A, the MRI system may obtain power supplied by a power supply configured to receive mains electricity and supplemental power supplied by an energy storage device. For example, the MRI system may obtain power from AC-to-DC power supply 206 and supplemental power from energy storage device 202, as described in connection with the examples of FIGS. 2A-6.

In sub-act 706B, the MRI system may generate, by using the obtained power and supplemental power, at least one gradient field using an at least one gradient coil. For example, the MRI system may generate a diffusion gradient field during a period of a DWI pulse sequence using the power obtained from the power supply configured to receive mains electricity and the supplemental power obtained from an energy storage device. It may be appreciated that the MRI system may use the obtained power and supplemental power to generate any number or type of gradient field based on the characteristics of the selected pulse sequence.

Figure 8A:
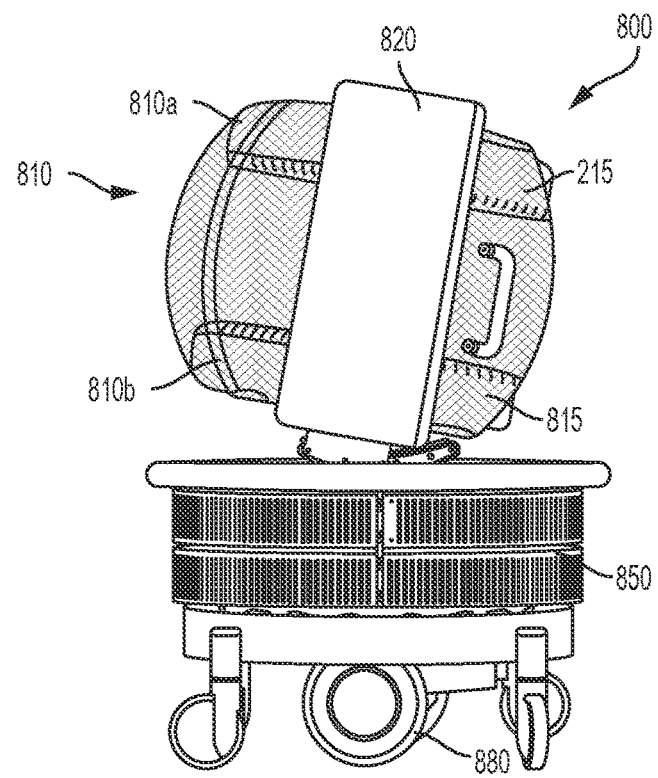
FIGS. 8A and 8B illustrate views of a portable MRI system, in accordance with some embodiments.
Figure 8B:
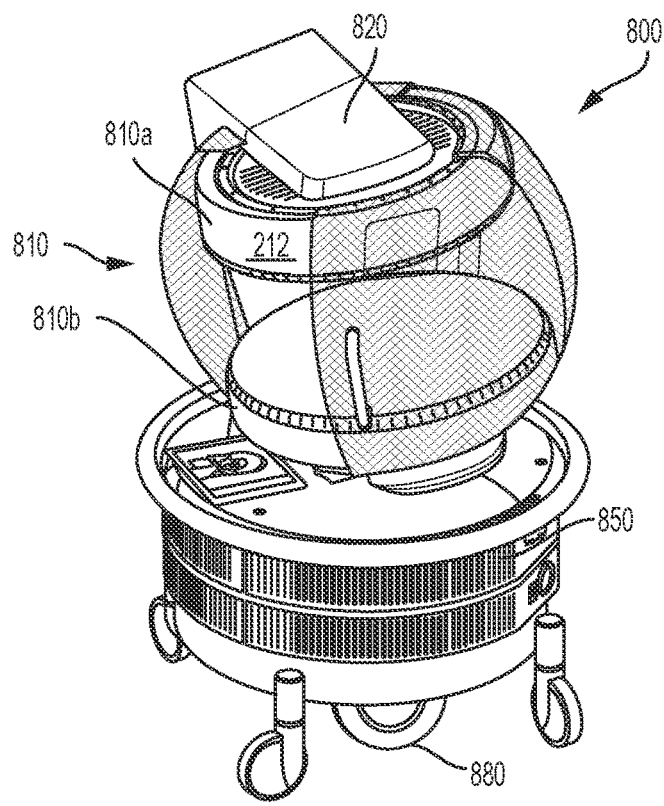

FIGS. 8A and 8B illustrate views of a portable MRI system in which any power systems as described in connection with FIG. 2A, 2B, 3A, 3B, 3C, 4, 5, or 6 may be implemented, in accordance with some embodiments of the technology described herein. Portable MRI system 800 comprises a $B_0$ magnet 810 (e.g., $B_0$ magnet 122 as described in connection with FIG. 1) formed in part by an upper magnet 810a and a lower magnet 810b having a ferromagnetic yoke 820 coupled thereto to increase the flux density within the imaging region. The $B_0$ magnet 810 may be housed in magnet housing 812 along with gradient coils 815 (e.g., gradient coils 128 as described in connection with FIG. 1 herein or any of the gradient coils described in U.S. Pat. No. 9,817,093, titled "Low Field Magnetic Resonance Imaging Methods and Apparatus," and filed on Sep. 4, 2015, which is herein incorporated by reference in its entirety). According to some embodiments, $B_0$ magnet 810 comprises an electromagnet. According to some embodiments, $B_0$ magnet 810 comprises a permanent magnet.

For example, in some embodiments, upper magnet 810a and a lower magnet 810b may each include permanent magnet blocks (not shown). The permanent magnet blocks may be arranged in concentric rings about a common center. The upper magnet 810a and the lower magnet 810b may be arranged in a bi-planar configuration, as shown in the examples of FIGS. 8A and 8B, such that the imaging region is located between the upper magnet 810a and the lower magnet 810b. In some embodiments, the upper magnet 810a and the lower magnet 810b may each be coupled to and supported by a ferromagnetic yoke 820 configured to capture and direct magnetic flux from the upper magnet 810a and the lower magnet 810b.

In some embodiments, $B_0$ magnet 810 may be configured to generate a $B_0$ magnetic field having a field strength that is less than or equal to 0.2 T, a field strength of less than or equal to 0.2 T and greater than or equal to 50 mT, a field strength of less than or equal to 0.1 T and greater than or equal to 50 mT, a field strength of less than or equal to 0.1 T and greater than or equal to 10 mT, a field strength of less than or equal to 0.1 T and greater than or equal to 20 mT, a field strength of less than or equal to 0.1 T and greater than or equal to 0.05 mT, a field strength of less than or equal to 0.2 T or greater than or equal to 20 mT, or field strength within any suitable range within these ranges.

Portable MRI system 800 further comprises a base 850 housing the electronics needed to operate the MRI system. For example, base 850 may house power supply system 112 (including power supply 112a, energy storage device 112b, and power electronics 112c), amplifiers 114, and/or transmit and receive circuitry 116 as described in connection with FIG. 1. Such power components may be configured to operate the MRI system (e.g., to operate the gradient coils 815 in accordance with a pulse sequence) using mains electricity provided to the power supply 112a (e.g., via a connection to a standard wall outlet and/or a large appliance outlet) and supplemental power supplied by the energy storage device 112b. For example, the power supply system 112 may include any of the power supply systems 200a, 200b, 300a, 300b, 300c, 400, 500, or 600 as described herein.

To facilitate transportation, a motorized component 880 is provided to allow portable MRI system to be driven from location to location, for example, using a control such as a joystick or other control mechanism provided on or remote from the MRI system. The motorized component 880 may be powered, in part or in whole, by an energy storage device of the MRI system (e.g., energy storage device 202 as described in connection with FIGS. 5 and 6). In this manner, portable MRI system 800 can be transported to the patient and maneuvered to the bedside to perform imaging, as illustrated in FIG. 9. For example, FIG. 9 illustrates a portable MRI system 900 that has been transported to a patient's bedside to perform a brain scan.

In some embodiments, portable MRI system 900 may be operated to perform a brain scan using power supplied by a power supply connected to mains electricity and supplemental power supplied by an energy storage device as described in connection with FIGS. 2A, 2B, 3A, 3B, 3C, 4, 5, 6, and 7 herein. For example, if a DWI pulse sequence is being used to perform the brain scan, supplemental power supplied by the energy storage device may be provided in addition to the power supplied by the power supply during periods of time corresponding to the generation of diffusion gradient pulses of the DWI pulse sequence.

Having thus described several aspects of at least one embodiment of this technology, it is to be appreciated that various alterations, modifications, and improvements will readily occur to those skilled in the art.

Various aspects of the technology described herein may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the technology described herein may be embodied as a method, examples of which are provided herein including with reference to FIG. 7. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A magnetic resonance imaging (MRI) system having an upper magnet and a lower magnet arranged in a bi-planar configuration, the system comprising:
   a power system configured to provide power to the MRI system, the power system comprising:
      an energy storage device; and
      a power supply configured to receive mains electricity; and
   a conveyance mechanism allowing the MRI system to be transported to different locations;
   wherein the energy storage device and the power supply are disposed on-board the MRI system such that the conveyance mechanism transports the energy storage device and the power supply with the MRI system; and
   wherein a power consumption of the MRI system is 4000 W or less.

2. The MRI system of claim 1, wherein the power consumption of 4000 W or less is a peak power consumption.

3. The MRI system of claim 2, wherein an average power consumption of the MRI system is 1500 W or less.

4. The MRI system of claim 1, wherein the power consumption of the MRI system is 3000 W or less.

5. The MRI system of claim 4, wherein the power consumption of 3000 W or less is a peak power consumption.

6. The MRI system of claim 1, wherein the power consumption of the MRI system is 2000 W or less.

7. The MRI system of claim 6, wherein the power consumption of 2000 W or less is a peak power consumption.

8. The MRI system of claim 1, wherein the power consumption of the MRI system is 1500 W or less.

9. The MRI system of claim 8, wherein the power consumption of 1500 W or less is an average power consumption.

10. The MRI system of claim 1, wherein the conveyance mechanism comprises a motorized component configured to receive power from the power system to facilitate transportation of the MRI system to different locations.

11. The MRI system of claim 10, wherein the motorized component comprises a motorized wheel.

12. The MRI system of claim 1, wherein the energy storage device is coupled to the MRI system using a bidirectional DC-to-DC power converter, and wherein the bidirectional DC-to-DC power converter comprises a synchronous buck DC-to-DC power converter, a synchronous boost DC-to-DC power converter, or a four switch buck-boost DC-to-DC power converter.

13. The MRI system of claim 1, wherein the power supply is further configured to provide power to the energy storage device and the MRI system concurrently.

14. The MRI system of claim 1, wherein the energy storage device comprises a battery.

15. The MRI system of claim 1, wherein the power supply is configured to provide power and the energy storage device is configured to provide supplemental power to the MRI system at least once per period of a pulse sequence.

16. The MRI system of claim 1, wherein the energy storage device and the power supply are configured to provide a peak power that is greater than or equal to 1500 W and less than or equal to 4000 W.

17. The MRI system of claim 1, wherein the energy storage device and the power supply are configured to provide a peak power for a length of time that is greater than or equal to 1 ms and less than or equal to 200 ms.

18. The MRI system of claim 1, further comprising:
a transfer switch configured to couple the energy storage device to a motorized component of the conveyance mechanism or to a magnetics system of the MRI system.

19. The MRI system of claim 1, further comprising:
a magnetics system comprising:
a $B_0$ magnet configured to generate a $B_0$ magnetic field having a field strength of less than or equal to 0.2 T and greater than or equal to 10 mT.

20. The system of claim 1, further comprising:
a magnetics system comprising:
a $B_0$ magnet configured to generate a $B_0$ magnetic field having a field strength of less than or equal to 0.1 T and greater than or equal to 50 mT.

\* \* \* \* \*